United States Patent [19]

Larry

[11] 3,944,696

[45] Mar. 16, 1976

[54] HIGH-ADHESION CONDUCTORS

[75] Inventor: John Robert Larry, Youngstown, N.Y.

[73] Assignee: E. I. Du Pont de Nemours and Company, Wilmington, Del.

[22] Filed: Feb. 18, 1975

[21] Appl. No.: 550,618

Related U.S. Application Data

[63] Continuation-in-part of Ser. No. 404,796, Oct. 9, 1973, Pat. No. 3,896,054, which is a continuation-in-part of Ser. No. 231,375, March 2, 1972, abandoned.

[52] U.S. Cl. ................ 428/208; 428/209; 428/210; 428/434; 428/901; 106/1; 106/53; 106/49; 252/514

[51] Int. Cl.$^2$.. C03C 3/10; B32B 17/06; B32B 3/00; B32B 7/14

[58] Field of Search .................. 106/1, 53; 252/514; 428/208, 209, 210, 901

[56] References Cited

UNITED STATES PATENTS

| | | | |
|---|---|---|---|
| 3,350,341 | 10/1967 | Short | 106/49 |
| 3,480,566 | 11/1969 | Hoffman | 106/53 |

*Primary Examiner*—Winston A. Douglas
*Assistant Examiner*—Mark Bell

[57] ABSTRACT

Glass frits for producing high-adhesion silver conductor patterns on ceramic substrates, useful in electronic circuitry. Metallizations of such frits. Conductors produced therewith.

6 Claims, No Drawings

HIGH-ADHESION CONDUCTORS

CROSS REFERENCE TO RELATED APPLICATION

This application is a continuation-in-part of my co-pending application U.S. Ser. No. 404,796, filed Oct. 9, 1973, now U.S. Pat. No. 3,896,054, which in turn is a continuation-in-part of my application U.S. Ser. No. 231,375, filed Mar. 2, 1972, now abandoned.

BACKGROUND OF THE INVENTION

This invention relates to conductor metallizations, and more particularly, to glass frits useful in producing metallizations to produce high-adhesion conductors on dielectric substrates.

Metallizations fired onto a dielectric substrate to produce conductor patterns usually comprise noble metals and an inorganic binder and are applied to the substrate as a dispersion thereof in an inert liquid medium. The metallic component provides the functional utility while the binder (e.g., glass, $Bi_2O_3$, etc.) bonds the metal to the substrate.

Silver (including Pd/Ag) conductor metallizations (glass frit plus noble metal) presently employed in high-performance electronic applications for producing fired conductor patterns on dielectric substrates are often deficient in that properties such as ease of solderability and high adhesion (initial and thermally aged) are not obtained simultaneously. To prevent adhesive failure, leads to conductor patterns are often designed to impart a mechanical strength which compliments the soldered bond strength. This is done by swaging pins in the ceramic substrate prior to soldering or by using clip-on leads. Better adhesion of the conductor to the substrate would eliminate these steps and present cost savings. Furthermore, in certain applications, not only is a conductor fire and a resistor fire necessary with a given substrate, but also an encapsulation fire (glass) at about 500°C., which thermal treatment often leads to poor solderability in Pd/Ag conductors located elsewhere on the substrate.

SUMMARY OF THE INVENTION

This invention provides glass frits useful in silver metallizing compositions for producing highly adherent conductor patterns on ceramic substrates. The glass frits consist essentially of the components listed in Table I, operable, preferred and optimum proportions being set forth in that Table.

TABLE I

| Component | GLASS FRITS (Wt. %) Operable Range | Preferred Range | Optimum Range |
|---|---|---|---|
| PbO | 5–22 | 8–22 | 8–15 |
| CaO | 1–5 | 2–5 | 2–3.3 |
| $Al_2O_3$ | 0.7–3 | 0.7–2.1 | 0.8–1.4 |
| $B_2O_3$ | 0.7–2.5 | 0.7–2 | 0.9–1.6 |
| $SiO_2$ | 5–20 | 7–19 | 7.5–12.5 |
| $Bi_2O_3$ | 50–85 | 50–80 | 66–80 |

This invention includes metallizations of the above glass frits and finely divided silver or palladium/silver, and those metallizations dispersed in an inert organic vehicle. Also, conductor patterns of such metallizations sintered (fired) on ceramic substrates.

DETAILED DESCRIPTION

The term silver metallizing compositions, as used herein, refers to compositions of finely divided glass frits and finely divided noble metal, wherein the noble metal is silver or silver/palladium. The present invention resides in the particular high-adhesion frit discovered by applicant, and hence, conventionally used silver/palladium proportions are involved, from metallizations of silver only to metallizations of about 2 parts Ag to 1 part palladium. Expressed differently, the noble metal content of the metallization is about 66–100% Ag and 0–34% Pd. The Pd/Ag metallizations may be mechanical mixtures or alloys.

The present invention provides improved glass frits for silver metallizations, as set forth in Table I.

The particle size of the solids does not normally exceed 40 microns. The ratio of metal to frit may be any conventionally used ratio, depending upon the properties desired. This ratio, although not a part of this invention, is normally in the range of 3–30% of the total solids content.

Dispersions of these solids may be prepared in any inert liquid vehicle, usually an organic liquid, with or without thickening and/or stabilizing agents and/or other common additives. Exemplary of the organic liquids which can be used are the aliphatic alcohols; esters of such alcohols, for example, the acetate and propionates; terpenes such as pine oil, $\alpha$- and $\beta$-terpineol and the like; solutions of resins such as the polymethacrylates of lower alcohols, or solutions of ethylcellulose, in solvents such as pine oil and the monobutyl ether of ethylene glycol monoacetate. The vehicle may contain or be composed of volatile liquids to promote fast setting after application to the substrate.

The ratio of inert vehicle to solids (glass and metal) may very considerably and depends upon the manner in which the dispersion of metallizing composition in vehicle is to be applied and the kind of vehicle used. Generally, from 1 to 20 parts by weight of solids per part by weight of vehicle will be used to produce a dispersion of the desired consistency. Preferably, 4–10 parts of solid per part of vehicle will be used.

As indicated above, the metallizing compositions of the present invention are printed onto ceramic substrates, after which the printed substrate is fired to mature the metallizing compositions of the present invention, thereby forming continuous conductors. Although not a part of this invention, the printed substrate is fired at a temperature below the melting point of the noble metal used, at a temperature high enough to mature (sinter) the conductor pattern. Typically, the firing is conducted at 750°–950°C. for 5–10 minutes at peak temperature.

These dispersions may be printed on any desired dielectric substrate; the substrate is normally a prefired (sintered) alumina ceramic substrate, although the metallization can be printed on green (unfired) substrates and cofired therewith.

The present invention is illustrated by the following examples and is contrasted with the comparative showings. In the examples and elsewhere in the specification and claims, all percentages, proportions and parts are by weight.

Examples 1-8

Glass frits with respective compositions set forth in Table II were prepared by melting together at 950°C.

the appropriate amounts of $Pb_3O_4$, $CaCO_3$, $Al_2O_3 \cdot 3H_2O$, $H_3BO_3$, $SiO_2$ and $Bi_2O_3$; pouring the melt into water to form a frit; milling the resultant frit; filtering the product through filter paper; and drying the resultant powdered frit (passes through No. 325 screen, U.S. Standard Sieve Scale).

TABLE II

GLASS FRITS USED IN EXAMPLES (Wt. %)

| Component | Glass A | Glass B | Glass C | Glass D |
|---|---|---|---|---|
| PbO | 21.8 | 14.5 | 10.9 | 8.7 |
| CaO | 4.9 | 3.3 | 2.4 | 2.0 |
| $Al_2O_3$ | 2.1 | 1.4 | 1.1 | 0.8 |
| $B_2O_3$ | 2.5 | 1.6 | 1.2 | 1.0 |
| $SiO_2$ | 18.7 | 12.5 | 9.4 | 7.5 |
| $Bi_2O_3$ | 50.0 | 66.7 | 75.0 | 80.0 |

The frits of Table II were combined with a Pd/Ag mixture (1/2.5) and dispersed in a vehicle of ethylcellulose and β-terpineol (1/9), as set forth in Table III. The palladium had a surface area of 9 $m^2/g.$, the silver 1.5 $m^2/g.$ The respective compositions were each screen printed on a series of prefired 96% $Al_2O_3$ substrates through a patterned 200-mesh screen having nine 80-mil × 80-mil openings aligned in a 3 × 3 matrix. The prints were dried, and then fired in a belt furnace at various firing sequences for various tests.

TABLE III

Pd/Ag METALLIZING COMPOSITIONS USED IN EXAMPLES (Wt. %)

| Component | Example No. 1 | 2 | 3 | 4 | 5 | 6 | 7 | 8 |
|---|---|---|---|---|---|---|---|---|
| Pd | 19.0 | 19.0 | 18.0 | 18.0 | 19.0 | 18.0 | 18.0 | 18.0 |
| Ag | 47.5 | 47.5 | 45.0 | 45.0 | 47.5 | 45.0 | 45.0 | 45.0 |
| Glass A | 8.0 | 12.0 | — | — | — | — | — | — |
| Glass B | — | — | 10.5 | 13.5 | — | — | — | — |
| Glass C | — | — | — | — | 12.0 | 16.0 | — | — |
| Glass D | — | — | — | — | — | — | 15.0 | 20.0 |
| Vehicle | 25.5 | 21.5 | 26.5 | 23.5 | 21.5 | 21.0 | 22.0 | 17.0 |

In two series of firings, separate samples were fired consecutively in a belt furnace at 850°C., 760°C. and 500°C. or at 760°C., 760°C., and 500°C. (8 minutes at peak at 850°C. and 760°C.; 2 minutes at peak at 500°C.), to simulate a process involving a conductor fire, resistor fire, and encapsulant fire, as often occurs in hybrid microelectronics fabrication. To test the adhesion of the conductor in each series, wire leads were then attached to the conductor pads by placing a 20-guage pretinned copper wire across three of the fired metallization pads and dipping in a solder pot (62/36/2, Sn/Pb/Ag) at 220°C. Bond strengths were then measured by pulling the soldered leads with an Instron tester. At least nine pads were pulled for each sample to obtain a representative bond strength. Results are reported in Table IV under the columns headed "Initial." A second series of aged samples were similarly tested (after the above-described triple firing test, the soldered chip with lead attached was held at 150°C. for 48 hours; results are found in Table IV under the columns headed "Aged.").

TABLE IV

ADHESION VALUES (LBS.) OF FIRED METALLIZATION

| Example No. | After 760/760/500°C. Firing Sequence Initial | After 760/760/500°C. Firing Sequence Aged | After 850/760/500°C. Firing Sequence Initial | After 850/760/500°C. Firing Sequence Aged |
|---|---|---|---|---|
| 1 | — | — | 6.3 | 2.8 |
| 2 | — | — | 6.2 | 5.2 |
| 3 | 5.7 | 3.0 | 5.1 | 2.2 |
| 4 | 5.1 | 3.4 | 5.1 | 3.5 |
| 5 | 5.1 | 3.3 | 5.2 | 2.8 |
| 6 | 5.7 | 4.9 | 5.2 | 4.6 |
| 7 | 4.5 | 3.5 | 4.9 | 2.9 |
| 8 | 4.8 | 4.4 | 4.8 | 3.5 |

The solderability of the above samples for Examples 1–8 was observed to be the following: For Examples 1 and 2, the solderability of both the samples fired at both 760°/760°/500°C. and 850°/760°/500°C. was fair, while that for Examples 3-8 was good to excellent for those fired at 760°/760°/500°C. and excellent for those fired at 850°/760°/500°C. Similar samples from which the third (500°C.) firing was omitted (i.e., firings at 760°/760°C. and at 850°/760°C.) all exhibited excellent solderability.

Solder leach resistance was determined with the compositions of Examples 1–8. Samples were prepared having 20-mil wide conductor lines by the 850°/760°/500°C. triple fire process, for each composition. The samples were then dipped into a rosin flux (Dutch Boy 115); dip soldered in 62/36/2 Sn/Pb/Ag at 230°C. for 10 seconds; allowed to stand for 2–3 seconds for solder leveling; and quenched in tirchloroethylene. The cycle was repeated through 8 cycles, and in no case was the 20 -mil line leached through.

Comparative Showing A

It was found that it is important in this invention to provide the $Bi_2O_3$ as part of the frit, rather than by using separate additions of free, unfritted $Bi_2O_3$ and a glass frit. A composition was made by roll milling 15.5% Pd (9 $m^2/g.$), 46.5% Ag (1.5 $m^2/g.$), 4% glass (43.5% PbO, 9.8% CaO, 4.3% $Al_2O_3$, 4.9% $B_2O_3$ and 37.5% $SiO_2$), 10% $Bi_2O_3$ and 24% of the vehicle of Examples 1–8. This is quite similar in elemental constituents to the frit of Example 6. The composition gave poor solderability after the 760°/760°/500°C. firing cycles, and only slightly better solderability when fired at 850°/760°/500°C. Adhesion after an 850°/760°C. firing sequence was 5.5 pounds (initial) and 3.4 pounds (aged).

Comparative Showing B

The glass frits of this invention were compared with the performance of a prior art composition as follows. The Pd, Ag and vehicle of Examples 1–8 were used. A Ag/Pd composition of 15.5% Pd, 46.4% Ag, 3% glass frit (27.2% ZnO, 25.4% $B_2O_3$, and 23.5% $SiO_2$, 6.4% $Al_2O_3$, 4% $ZrO_2$, 1% BaO, 4% CaO, 8.5% $Na_2O$), 7% $Bi_2O_3$ and 27.4% vehicle, when fired in a belt furnace at 850°C. (8 min. peak) gave an initial adhesion of 5.2 pounds and an aged adhesion of only 1.8 pounds. Solder leach resistance was only 4 cycles, using the method employed in Examples 1–8.

Comparative showings R, S, T, U, V

I have conducted a series of experiments side by side using the same metal powders, vehicles and relative proportions of metal/glass/vehicle, printed on the same type of substrates, and the resulting printed substrates were fired under the same conditions and examined using the same test conditions. Only the glass binder was changed, to permit comparison of metallizations containing the glass of Hoffman U.S. Pat. No. 3,480,566 with that of the present application, to show both the improved behavior with the glasses of the present invention and the significance of the minor constituents in the glasses of the present invention.

The glasses used in this series of experiments are set forth in Table V. The glass powders were prepared by melting the constituents at 950°C., pouring the melt into water to form a frit and then ball-milling the frit to a fine powder which passed through a No. 325 screen (U.S. Standard Sieve Scale).

The metallizating compositions which were evaluated are shown in Table VI. The Pd had a surface area of 7m²/g., the silver 1.5m²/g. The vehicle is comprised of an ethyl cellulose-terpineol (1:9) system. All proportions and percentages are by weight.

The respective compositions were each screen-printed on a series of prefired 96% $Al_2O_3$ substrates through a patterned 200 mesh screen having nine 80 mil × 80 mil openings aligned in a 3 × 3 matrix. The prints were dried and then fired in a belt furnace at various firing sequences for various tests.

In two series of firings separate samples were fired consecutively in a belt furnace at 850°C., 760°C. and 500°C. or at 760°C., 760°C., and 500°C. (8 min. at peak at each of 850°C. and 760°C.; 2 min. at peak at 500°C.) to simulate a process involving a conductor fire, resistor fire, and encapsulant fire, as often occurs in hybrid microelectronics fabrication. To test the adhesion of the conductor in each series, wire leads were then attached to the conductor pads by placing a 20-guage pretinned copper wire across three of the fired metallization pads and dipping in a solder pot (62/36/2, Sn/Pd/Ag) at 220°C. Bond strengths were then measured by pulling soldered leads with an Instron tester. At least nine pads were pulled for each sample to obtain a representative bond strength. Results are reported in Table VII under the columns headed "Initial". A second series of aged samples were similarly tested (after the above-described triple firing test, the soldered chip with lead attached was held at 150°C. for 48 hours, then pulled; results are found in Table VII under the columns headed "Aged").

The solderability of the above samples is set forth in Table VIII. The solder leach resistance was determined on the fired parts prepared with each of the above glasses. Samples were prepared having 20-mil-wide conductor lines by the above-described 850°/760°/500°C. triple fire process for each composition. The samples were then dipped into a rosin flux (Dutch Boy 115); dip soldered in 62 Sn/36 Pb/2 Ag at 230°C. for 10 seconds; allowed to stand 2 to 3 seconds for solder leveling; and quenched in trichloroethylene. The cycle was repeated until the 20-mil line leached through. Table IX summarizes the number of such solder leach cycles which each fired conductor composition withstood.

TABLE V

| Glass Component | Present Invention Glass A | Present Invention Glass C | Hoffman Glasses Ex. 1 | Hoffman Glasses Ex. 23 | Hoffman Glasses Ex. 26 |
|---|---|---|---|---|---|
| $Bi_2O_3$ | 50.0 | 75.0 | 75.5 | 49.0 | 73.0 |
| PbO | 21.8 | 10.9 | 6.5 | 45.0 | 20.0 |
| $B_2O_3$ | 2.5 | 1.2 | 6.5 | 2.0 | — |
| $SiO_2$ | 18.7 | 9.4 | 6.5 | 2.0 | 5.0 |
| CaO | 4.9 | 2.5 | — | — | — |
| $Al_2O_3$ | 2.1 | 1.1 | — | — | — |
| $WO_3$ | — | — | 5.0 | — | 2.0 |
| $V_2O_5$ | — | — | — | 2.0 | — |

TABLE VI

| Components of Metallization (wt.%) | Showings R | S | T | U | V |
|---|---|---|---|---|---|
| Pd | 18 | 18 | 18 | 18 | 18 |
| Ag | 45 | 45 | 45 | 45 | 45 |
| Present Invention, Glass C | 16 | — | — | — | — |
| Hoffman Ex. 1 Glass | — | 16 | — | — | — |
| Hoffman Ex. 26 Glass | — | — | 16 | — | — |
| Present Invention, Glass A | — | — | — | 10 | — |
| Hoffman Ex. 23 Glass | — | — | — | — | 10 |
| Vehicle | 21 | 21 | 21 | 27 | 27 |

TABLE VII

| ADHESION VALUES (LBS.) — FIRED METALLIZATION | | | | |
|---|---|---|---|---|
| Showings of Table VI | 760/760/500°C. Initial | 760/760/500°C. Aged | 850/750/500°C Initial | 850/750/500°C Aged |
| R | 6.6 | 5.9 | 6.4 | 5.2 |
| S | 6.3 | 5.5 | 5.8 | 4.1 |
| T | 6.0 | 4.4 | 6.1 | 3.9 |
| U | 5.6 | 5.9 | 6.5 | 4.4 |
| V | 4.8 | 1.5 | 3.9 | 1.6 |

TABLE VIII

| SOLDERABILITY | | |
|---|---|---|
| Showings of Table VI | 760/760/500°C. Firing Sequence | 850/760/500°C. Firing Sequence |
| R | Good | Good |
| S | Good | Good |
| T | Poor | Fair |
| U | Fair | Good |
| V | Fair | Fair |

TABLE IX

| SOLDER LEACH RESISTANCE (850/760/500°C.) | |
|---|---|
| Showings of Table V | No. of Cycles to Failure |
| R | 8 |
| S | 7 |
| T | 8 |
| U | 6 |
| V | 5 |

The above data illustrate the improved results obtained with the glasses of the present invention.

I claim:

1. In electrical conductor patterns of silver or palladium silver particles plus inorganic binder therefor, adherent to a ceramic substrate, conductor patterns of improved soldering characteristics and improved adhesion to the substrate, wherein said inorganic binder is a glass consisting essentially of, by weight, 5-22% PbO
1-5% CaO
0.7-3% $Al_2O_3$
0.7-2.5% $B_2O_3$
5-20% $SiO_2$ and
50-85% $Bi_2O_3$ 2. Conductor patterns according to claim 1 wherein said glass consists essentially of, by weight, 8-22% PbO
2-5% CaO
0.7-2.1% $Al_2O_3$
0.7-2% $B_2O_3$
7-19% $SiO_2$ and
50-80% $Bi_2O_3$ 3. Conductor patterns according to claim 2 wherein said glass consists essentially of, by weight, 8-15% PbO
2-3.3% CaO
0.8-1.4% $Al_2O_3$
0.9-1.6% $B_2O_3$
7.5-12.5% $SiO_2$
66-80% $Bi_2O_3$ 4. Conductor patterns according to claim 3 wherein said glass consists essentially of, by weight, 14.5% PbO
3.3% CaO
1.4% $Al_2O_3$
1.6% $B_2O_3$
12.5% $SiO_2$
66.7% $Bi_2O_3$ 5. Conductor patterns according to claim 3 wherein said glass consists essentially of, by weight, 10.9% PbO
2.4% CaO
1.1% $Al_2O_3$
1.2% $B_2O_3$
9.4% $SiO_2$
75.0% $Bi_2O_3$ 6. Conductor patterns according to claim 3 wherein said glass consists essentially of, by weight, 8.7% PbO
2.0% CaO
0.8% $Al_2O_3$
1.0% $B_2O_3$
7.5% $SiO_2$
80.0% $Bi_2O_3$

* * * * *